United States Patent
Fritsch et al.

(10) Patent No.: US 10,002,661 B2
(45) Date of Patent: *Jun. 19, 2018

(54) STRUCTURE FOR REDUCING PRE-CHARGE VOLTAGE FOR STATIC RANDOM-ACCESS MEMORY ARRAYS

(71) Applicant: International Business Machines Corporation, Armonk, NY (US)

(72) Inventors: Alexander Fritsch, Esslingen (DE); Amira Rozenfeld, Hertzeliyya (IL); Rolf Sautter, Bondorf (DE); Dieter Wendel, Schoenaich (DE)

(73) Assignee: International Business Machines Corporation, Armonk, NY (US)

(*) Notice: Subject to any disclaimer, the term of this patent is extended or adjusted under 35 U.S.C. 154(b) by 0 days. days.

This patent is subject to a terminal disclaimer.

(21) Appl. No.: 15/587,789

(22) Filed: May 5, 2017

(65) Prior Publication Data

US 2017/0243633 A1    Aug. 24, 2017

Related U.S. Application Data

(63) Continuation of application No. 15/155,246, filed on May 16, 2016, now Pat. No. 9,727,680, which is a
(Continued)

(51) Int. Cl.
- *G11C 5/06* (2006.01)
- *G11C 11/416* (2006.01)
- *G06F 17/50* (2006.01)

(52) U.S. Cl.
CPC ........ *G11C 11/416* (2013.01); *G06F 17/5081* (2013.01)

(58) Field of Classification Search
CPC ... G11C 11/416; G11C 11/418; G11C 11/419; G11C 7/1048; G11C 7/12; G11C 7/18;
(Continued)

(56) References Cited

U.S. PATENT DOCUMENTS

| 6,233,186 B1 | 5/2001 | Tonda |
| 7,075,855 B1 | 7/2006 | Bunce et al. |

(Continued)

FOREIGN PATENT DOCUMENTS

WO    2017025848 A1    2/2017

OTHER PUBLICATIONS

Anonymous, "Multi Vt Reduced-Swing Voltage Bitline Generation and Maintenance Circuit for SRAM", ip.com, An IP.com Prior Art Database Technical Disclosure, 9 pages, IP.com No. 000240713. IP.com, Electronic Publication Feb. 19, 2015.
(Continued)

*Primary Examiner* — Tha-O H Bui
(74) *Attorney, Agent, or Firm* — Robert J. Shatto

(57) ABSTRACT

A memory cell arrangement of SRAM cell groups may be provided in which in each of the groups multiple SRAM cells are connected to an input of a local read amplifier by at least one common local bit-line. Outputs of the amplifiers are connected to a shared global bit-line. The global bit-line is connected to a pre-charge circuit, and the pre-charge circuit is adapted for pre-charging the global bit-line with a programmable pre-charge voltage before reading data. The pre-charge circuit comprises a limiter circuit which comprises a pre-charge regulator circuit connected to the global bit-line to pre-charge the global bit-line with the programmable pre-charge voltage, and an evaluation and translation circuit connected to the pre-charge regulator circuit and the global bit-line to compensate leakage current of the global bit-line without changing its voltage level.

20 Claims, 7 Drawing Sheets

Related U.S. Application Data continuation of application No. 14/822,089, filed on Aug. 10, 2015, now Pat. No. 9,431,098.

(58) Field of Classification Search
CPC ............. G06F 17/5081; G06F 17/5045; H01L 23/528; H01L 27/1104
USPC .......................................................... 365/72
See application file for complete search history.

(56) References Cited

U.S. PATENT DOCUMENTS

| | | | |
|---|---|---|---|
| 7,502,276 B1* | 3/2009 | Behrends ................. | G11C 8/10 365/154 |
| 7,570,527 B2 | 8/2009 | Houston | |
| 7,936,624 B2 | 5/2011 | Clinton | |
| 8,279,687 B2 | 10/2012 | Adams et al. | |
| 8,331,180 B2 | 12/2012 | Adams et al. | |
| 8,842,487 B2 | 9/2014 | Behrends et al. | |
| 8,947,970 B2 | 2/2015 | Pelley et al. | |
| 9,431,098 B1* | 8/2016 | Fritsch ................. | G11C 11/419 |
| 2003/0156478 A1* | 8/2003 | Maruyama ............ | G11C 7/065 365/200 |
| 2004/0076059 A1 | 4/2004 | Khellah et al. | |
| 2006/0067144 A1 | 3/2006 | Liu | |
| 2007/0070773 A1 | 3/2007 | Houston | |
| 2007/0171747 A1 | 7/2007 | Hunter et al. | |
| 2009/0175107 A1 | 7/2009 | Christensen et al. | |
| 2010/0296354 A1 | 11/2010 | Kobayashi | |
| 2011/0280088 A1* | 11/2011 | Adams ................. | G11C 11/419 365/189.11 |
| 2013/0156478 A1 | 6/2013 | Deno | |
| 2014/0016402 A1 | 1/2014 | Burnett et al. | |
| 2014/0112064 A1 | 4/2014 | Adams et al. | |
| 2014/0126273 A1 | 5/2014 | Behrends et al. | |
| 2017/0046465 A1 | 2/2017 | Fritsch et al. | |
| 2017/0047111 A1 | 2/2017 | Fritsch et al. | |
| 2017/0047112 A1 | 2/2017 | Fritsch et al. | |

OTHER PUBLICATIONS

Kabir et al., "Fast & Low-Power Consuming SRAM Design by Fast Precharging Using Equalizer and Sense Circuit", Journal of Electron Devices, vol. 9, 20011, pp. 325-334, © JED, ISSN: 1682-3427.

Nirschl et al., "High Speed, Low Power Design Rules for SRAM Precharge and Self-timing under Technology Variations", Infineon Technologies, Germany and the Technical University Munich, Institute of Technical Electronics, Germany, 10 pages, http://citeseerx.ist.psu.edu/viewdoc/download?doi=10.1.1.119.3735&rep=rep1&type=pdf.

International Search Report, Application No. PCT/IB2016/054559, dated Dec. 16, 2016, 10 pgs.

List of IBM Patents or Patent Applications Treated as Related, signed May 2, 2017, 2 pgs.

* cited by examiner ered around a higher than can all ran dic cells designs, the Do dump ceramic

STRUCTURE FOR REDUCING PRE-CHARGE VOLTAGE FOR STATIC RANDOM-ACCESS MEMORY ARRAYS

BACKGROUND

The invention relates generally to a read pre-charge level of SRAM cells, and more specifically, to memory cell arrangements of SRAM cell groups. The invention relates further to a related design structure.

SRAM cells are often arranged in a domino-logic structure in which two or more SRAM (static random access memory) cells are connected in parallel to local bit-lines. An amplifier between local bit-lines and a shared global bit-line helps to separate the local bit-lines from the global bit-line. Typically, both, the local and the global bit-lines may be pre-charged high before a read operation, and may be discharged, or "pulled-down," to ground during a read operation. This may enable a higher read rate than detecting the status of the global bit-line directly. A particular cell may be selected for reading by activating the cell's word line. If the discharged local bit-line is the one that is coupled to the global bit-line, a discharge of the local bit-line may activate logic that discharges the global bit-line.

Using this mechanism for detecting a status of a SRAM cell, it may not be required to pre-charge a local bit-line and/or a global bit-line to the full amount of Vdd (also known as the power supply voltage). In other words, a full swing pre-charge may not be required.

Other documents have been dealt with this area. E.g., U.S. Pat. No. 8,947,970 B2 discloses "a memory device comprising a plurality of static random access memory (SRAM) bit cells, and a word line driver coupled to provide a word line signal to the bit cells. The word line driver receives a global word line signal that remains active while the word line signal is asserted and subsequently de-asserted."

US Patent Application 2010/0296354-A1 discloses a static random access memory which includes "a memory cell connected to a pair of bitlines and supplied with the power supply voltage from a first power supply a pre-charge circuit connected with the pair of bitlines . . . and a voltage reducing circuit connected between the precharge circuit and the first power supply."

However, a problem related to the global bit-line remains. The global bit-lines build an intrinsic capacitor. Because a plurality of the above-mentioned amplifiers may be connected to the global bit-line, the global bit-line requires a lot of pre-charging power during a read operation of SRAM cells. As the SRAM cell may be pre-charged in a first phase of a read operation and discharged in an evaluation phase, depending on the SRAM cells content, about 50% of global bit-lines are charged and/or discharged during every memory cycle. A power equivalent to the operation frequency times the effective capacitor of the global bit-lines times the power supply voltage (Vdd) times the pre-charge voltage may be required. This may contribute enormously to the power consumption of an SRAM array. Because SRAM cells are often used as level-1 or level-2 caches in processors, the power consumption of these SRAM arrays contributes significantly to the power consumption of the processor.

Hence, there may be a need for a reduction of the amount of power required to pre-charge the global bit-lines in the first phase of a read operation.

SUMMARY

This need may be addressed by a memory cell arrangement of Static Random-Access Memory (SRAM) cell groups, and design structure according to the independent claims.

According to one aspect of the present invention, a memory cell arrangement of SRAM cell groups may be provided. In each of the groups, multiple SRAM cells may be connected to an input of a local read amplifier by at least one common local bit-line. Outputs of the amplifiers may be connected to a shared global bit-line which may be connected to a pre-charge circuit. The pre-charge circuit may be adapted for pre-charging the shared global bit-line with a programmable pre-charge voltage before reading data. The pre-charge circuit may include a limiter circuit. The limiter circuit may include a pre-charge regulator circuit connected to the shared global bit-line to pre-charge the global bit-line with the programmable pre-charge voltage. An evaluation and translation circuit may be connected to the pre-charge regulator circuit and the global bit-line to compensate for leakage current of the global bit-line without changing its voltage level.

According to another aspect of the present invention, a design structure may be provided. The design structure may be tangibly embodied in a machine-readable storage medium used in a design process of a memory cell arrangement of SRAM cell groups. The design structure may have elements that, when processed in a semiconductor manufacturing facility, may produce a memory cell arrangement of SRAM cell groups in which in each of the groups multiple SRAM cells may be connected to an input of a local read amplifier by at least one common local bit-line, and in which outputs of the amplifiers are connected to a shared global bit-line. The shared global bit-line may be connected to a pre-charge circuit, and the pre-charge circuit may be adapted for pre-charging the shared global bit-line with a programmable pre-charge voltage before reading data. The pre-charge circuit may comprise a limiter circuit which may comprise a pre-charge regulator circuit which may be connected to the shared global bit-line to pre-charge the shared global bit-line with the programmable pre-charge voltage, and an evaluation and translation circuit connected to the pre-charge regulator circuit and the shared global bit-line to compensate leakage current of the global bit-line without changing its voltage level.

The proposed memory cell arrangement of SRAM cell groups may offer a couple of advantages and technical effects:

The proposed memory cell arrangement of SRAM cell groups is not dependent on any specific SRAM cell design. For example, six transistor 1-bit SRAM cells may be used as well as 8-transistor 1-bit SRAM cells. Typically, field effect transistors (FET) may be used. They may be p-type FETs or n-type FETs or a combination of both. The inventive concept may also be applied to bipolar based SRAM cells. The pre-charge level of the shared global bit-line may not depend on any switching threshold of a CMOS inverter and may thus not be fixed but may be programmable depending on environmental parameters, e.g., the power supply voltage, the temperature of the chip, or the operating frequency. Thus, the pre-charge level may stay constant even if the power supply voltage may change. Thus, the pre-charge level of the shared global bit-line may depend only on a reference voltage Vref, which may allow for a lower pre-charge level even if the power supply voltage may increase. This may result in an even higher power saving.

Additionally, no history effects have to be dealt with because the shared global bit-line keeper part of the evaluation and translation circuits maintains the pre-charge level. Moreover, the pre-charge level may be controlled for each shared global bit-line independently. The global bit-lines may be single-ended global bit-lines.

Because of a decoupling of the pre-charge circuit and the SRAM cells, there are no dependencies to the SRAM cell characteristics.

It may also be noted that the pre-charge level of the global bit-line may be lower than the power supply voltage minus a threshold value of, e.g., a CMOS inverter and, in particular, below half of Vdd. A clear effect is that more power can be saved during operation if compared to known technologies.

In the following, additional embodiments of the memory cell arrangement of SRAM cell groups will be described.

According to one preferred embodiment of the memory cell arrangement of SRAM cell groups, the programmable pre-charge voltage is below half of a value of a power supply voltage Vdd. This has the advantage of a higher power saving effect if compared to technologies able to reduce the pre-charge level of the shared global bit-line to half of Vdd. The lower a pre-charge level of the global bit-line may be with a stable operation, the more power may be saved. A skilled person will appreciate that every additional milliwatt of saved power is instrumental in making SRAM cells in SRAM chips or as part of processors more efficient.

According to another preferred embodiment of the memory cell arrangement of SRAM cell groups, the pre-charge regulator circuit may comprise a 1st p-FET connected with its source to the power supply voltage Vdd and its drain to a first terminal of a pre-charge switch. This pre-charge switch may be connected with its second terminal to the shared global bit-line. A 1st n-FET may be connected with its source to the first terminal of the pre-charge switch, wherein a drain of the 1st n-FET may be connected to a gate of the 1st p-FET as well as to a first terminal of a first programmable resistor which is connected with its second terminal to the power supply voltage Vdd. A gate of the 1st n-FET may be connected to a voltage Vref signal.

It may be noted that the first resistor may be interpreted as an equivalent circuit diagram for a transistor or FET having a preset voltage connected to its gate. Thus, this may be seen as a programmable resistor.

It may also be noted that the voltage Vref may define to which level the shared global bit-line may be pre-charged before a second part of a read cycle of an activated—e.g., by the associated word line—SRAM cell.

According to another preferred embodiment of the memory cell arrangement of SRAM cell groups, the evaluation and translation circuit may comprise a 2nd n-FET which may be connected with its source to the shared global bit-line and with its drain to a first terminal of a second programmable resistor which may be connected with its second terminal to the power supply voltage Vdd. A gate of the 2nd n-FET may be connected to the Vref signal, and a global bit-line out terminal may be connected to the drain of the 2nd n-FET.

Similar to the first resistor, the second resistor may be seen as an equivalent circuit diagram for a transistor or FET having a preset voltage connected to its gate. Thus, this may also be seen as a programmable resistor.

According to an additional embodiment of the memory cell arrangement of SRAM cell groups, the Vref signal may be adapted for controlling a pre-charge level of the shared global bit-line. Thus, the pre-charge level may be controllable independently of the power supply voltage. The pre-charge level of the shared global bit-line can be controlled independently such that a lowest possible pre-charge level may be used which ensures a stable operation of the SRAM cell read operation.

According to an advantageous embodiment of the memory cell arrangement of SRAM cell groups, the pre-charge regulator circuit may comprise a 2nd p-FET connected with its drain to the shared global bit-line and its source to the power supply voltage Vdd. A gate of a 2nd p-FET may be connected to a drain of a 3rd p-FET transistor which source may be connected to the power supply voltage Vdd. A drain of a 4th p-FET may also be connected to the gate of the second p-FET and which source may be connected to the power supply voltage Vdd. A 3rd n-FET may also be connected with its drain to the gate of the 2nd p-FET and with its source to a drain of a 4th n-FET which source may be connected to the shared global bit-line.

A gate of the 4th n-FET and a gate of the 3rd p-FET may together be connected to a global bit-line pre-charge line GPCHG. A gate of the 3rd n-FET may be connected to a Vref line, and the gate of the 4th p-FET is connected to a Vbias-p line.

With this, the pre-charge regulator circuit is active during a "high" phase and inactive during a "low" phase of GPCHG. If the pre-charge regulator circuit is active, the 6th p-FET is controlled such that the more the voltage level of the global bit-line deviates from the pre-charge level set by means of the reference voltage Vref, the more current the $6^{th}$ p-FET supplies to the global bit-line. When the programmed pre-charge level is reached, the current drive capability of the 6th p-FET is largely reduced. In this state, the 6th p-FET will only compensate for the shared global bit-line leakage to keep the pre-charged level constant. If the pre-charge regulator circuit is inactive, the 6th p-FET is turned off.

According to one permissive embodiment of the memory cell arrangement of SRAM cells a drain of a 5th n-FET may be connected to the shared global bit-line and connected with its source connected to ground. A gate of the 5th n-FET may be connected to a voltage Vbias-n signal adapted for keeping the pre-charge regulator circuit and the evaluation and translation circuit in stable working conditions. This circuit may ensure a stable charge level of the shared global bit-line even in the case if no or only weak leak currents are present.

According to one additional embodiment of the memory cell arrangement of SRAM cell groups, the evaluation and translation circuit may comprise a 6th n-FET connected with its source to the shared global bit-line and with its drain to the global bit-line out. A 5th p-FET may be connected with its drain to the global bit-line out terminal and with its source to the power supply voltage Vdd. A 6th p-FET may be connected with its source to the power supply voltage Vdd, and with its drain to a source of a 7th p-FET which is connected with its drain to the global bit-line out terminal.

Furthermore, a gate of the 7th p-FET may be connected to a drain of an 8th p-FET which may be connected with its source to the power supply voltage Vdd. And, the gate of the 7th p-FET may also be connected to a drain of a 7th n-FET which may be connected with its source to ground.

In this embodiment, the Vref signal may be connected to a gate of the 6th n-FET, the Vbias-p signal may be connected to a gate of the 6th p-FET, and an inverted signal of the global bit-line pre-charge signal GPCHGN may be connected to a gate of the 5th p-FET.

This embodiment may be seen as a first implementation of the evaluation and translation circuit. The 6th n-FET may separate the shared global bit-line which has a high capacity and the global bit-line out line which has a low capacity compared to the shared global bit-line.

The 7th p-FET, the 8th p-FET and the 7th n-FET may be seen as a feedback circuit that interrupts the path from Vdd through the 6th and 7th p-FET to the a global bit-line out (terminal) in order to prevent a cross-current from Vdd to the pull-down device when a read amplifier tries to discharge the shared global bit-line and thus, to save power and accelerate the evaluation phase.

With the 6th n-FET connected with its source to the shared global bit-line and with its drain to the global bit-line out terminal, a separation between the shared global bit-line and the global bit-line out terminal may be achieved. This way, the shared global bit-line may allow a much lower pre-charge level than detectable at the global bit-line out terminal. The evaluation and translation circuit may enable the pre-charge level translation.

According to another embodiment of the memory cell arrangement of SRAM cell groups, the evaluation and translation circuit may comprise an 8th n-FET which may be connected with its source to the shared global bit-line and with its drain to a source of a 9th n-FET, which is connected with its drain to a 9th p-FET, which may be connected with its source to the power supply voltage Vdd. A 10th p-FET may be connected with its source to the power supply voltage Vdd and with its drain to the drain of the 9th p-FET. An 11th p-FET may be connected with its source to the power supply voltage Vdd and with its gate to the drain of the 9th n-FET.

A drain of the 11th p-FET may be connected to the global bit-line out terminal, a drain of a 10th n-FET and a drain of an 11th n-FET may be connected to the global bit-line out terminal and, a source of the 10th n-FET and a source of the 11th n-FET may be connected to ground Vss.

The Vref signal may be connect to a gate of the 9th n-FET, the Vbias-p signal may be connected to a gate of the 9th p-FET, an inverted signal of the global bit-line pre-charge signal GPCHGN may be connected to a gate of the 10th p-FET, and the global bit-line pre-charge signal GPCHG may be connected to a gate of the 10th n-FET, wherein the Vbias-n signal may be connected to a gate of the 11th n-FET.

This embodiment may represent a second, alternative implementation of the evaluation and translation circuit. It may be faster than the first embodiment of the evaluation and translation circuit (as discussed above). The first embodiment may save more power and may be less complex.

According to another embodiment of the memory cell arrangement of SRAM cell groups, the evaluation and translation circuit may comprise a 12th n-FET which may be connected with its source to the shared global bit-line and with its drain to a source of a 13th n-FET; this 13th n-FET may be connected with its drain to a 12th p-FET which may be connected with its source to the power supply voltage Vdd.

A 13th p-FET may be connected with its source to the power supply voltage Vdd and with its drain to the drain of the 12th p-FET. A 14th p-FET may be connected with its source to the power supply voltage Vdd and with its gate to the drain of the 13th n-FET. A 14th n-FET may be connected with its drain to a drain of the 14th p-FET and with its source to a drain of a 15th n-FET which is connected with its source to ground. A 16th n-FET may be connected with its drain to the drain of the 14th p-FET and with its source to ground.

An inverter, which may be connected with its input to the drain of the 14th FET and with its output to the global bit-line out terminal, may also be part of this embodiment. Also, a 15th p-FET may be connected with it source to the power supply voltage Vdd and with its drain to the drain of the 14 p-FET and which is connected with its gate to the global bit-line out terminal. A gate of the 14th n-FET may also be connected to the global bit-line out terminal.

The Vref signal may be connected to a gate of the 13th n-FET, the Vbias-p signal may connected to a gate of the 12th p-FET, an inverted signal of the global bit-line pre-charge signal GPCHGN may be connected to a gate of the 13th p-FET, the global bit-line pre-charge signal GPCHG may be connected to a gate of the 16th n-FET, and the Vbias-n signal may be connected to a gate of the 15th n-FET.

This embodiment may represent a third alternative for the evaluation and translation circuit. It may represent a good compromise between the first implementation and the second implementation, as its operational speed may be in-between the first and the second implementation of the evaluation and translation circuit, as discussed above. On the other side, it may save more power than the second implementation embodiment of the evaluation and translation circuit. Thus, a designer may have a choice between different options of the same basic principle, namely reducing the pre-charge level of the shared global bit-line as much as possible in a given environment.

According to a further optional embodiment of the memory cell arrangement of SRAM cell groups, at least one out of the group comprising the reference voltage Vref, the Vbias-n signal, or the Vbias-p signal may be controlled by a process-voltage-temperature circuit in order to reflect actual operating parameters. This may have the advantage that real operation parameters may be used to operate the memory cell arrangement of SRAM cell at a defined low power consumption operation point.

According to one permissive embodiment of the design structure, the design structure may comprise a net-list which may describe the memory cell arrangement of SRAM cell groups. This net-list may be required for automatic production systems for the memory cell arrangement of SRAM cells.

And according to another permissive embodiment of the design structure, the design structure may include at least one set of test data, characterization data, verification data, or design specifications.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1:
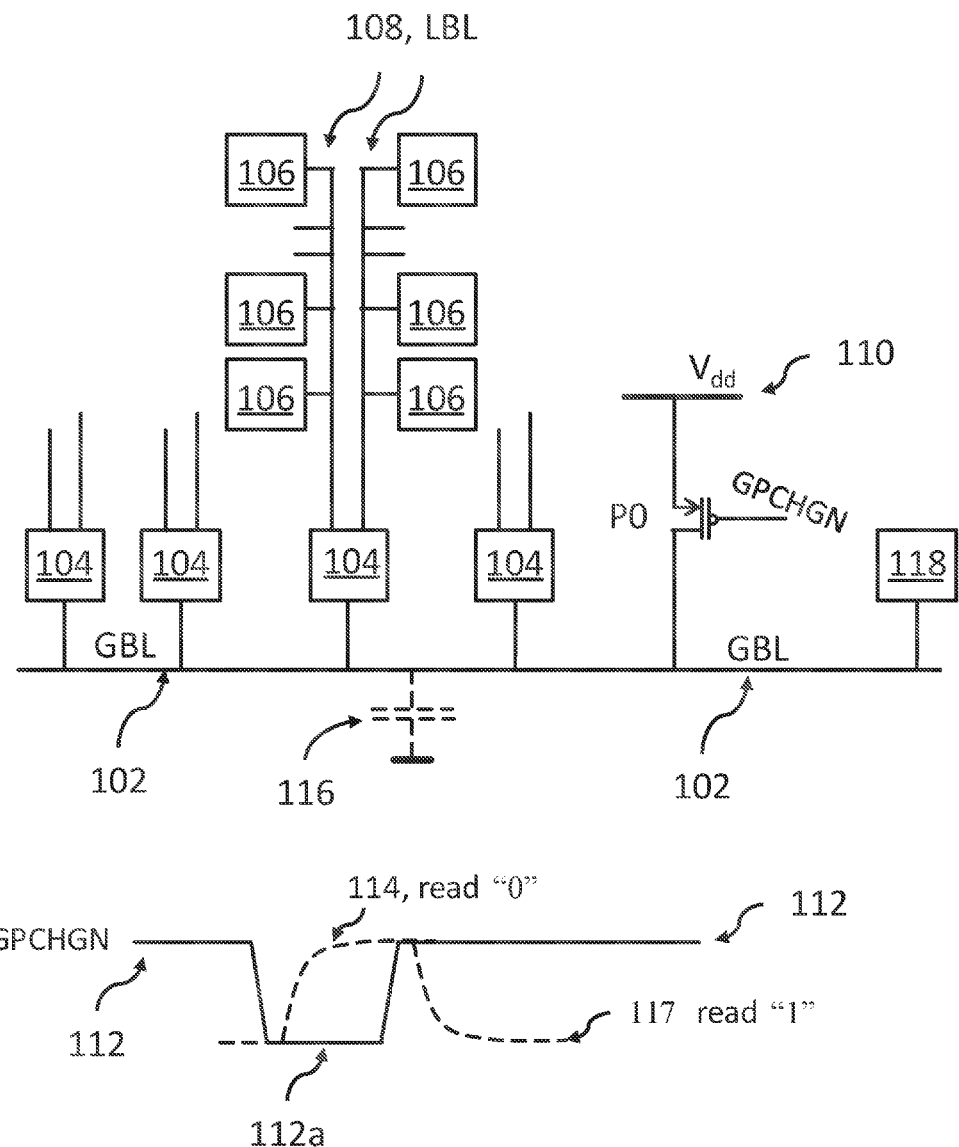
FIG. 1 illustrates an example of SRAM cells connected to a shared global bit-line, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

In the context of this description, the following conventions, terms and/or expressions may be used:

The term 'group multiple SRAM cells' may denote a plurality of Static Random-Access Memory (SRAM) cells connected to a common output line, aka the local bit-line. The local bit-line may be shared by a plurality of SRAM cells and may be connected to an input of a local bit-line amplifier.

The term 'local read amplifier' may denote the above-mentioned local bit-line amplifier which may be located between a common local bit-line and a global bit-line.

The term 'local bit-line' may denote the common output line for a plurality of SRAM cells connecting the plurality of SRAM cells to a local read amplifier.

The term 'global bit-line' or also "shared global bit-line" may denote a line connected to a plurality of read amplifiers or local read amplifiers. A characteristic of the global bit-line may be its comparatively high parasitic capacity due to its size and the comparable high number of local read amplifiers connected to it.

The term 'pre-charge circuit' may denote a circuit comprising a plurality of electronic components to pre-charge a bit line of any kind before a read cycle of an SRAM connected directly or indirectly to the global bit-line. In a first phase of a read cycle, the global bit-line may be pre-charged and potentially discharged during a second phase of a read cycle depending on the logical level of the bit read out of the SRAM cell. More details are explained in reference to FIG. 1.

The term 'pre-charge regulator circuit' may refer to a circuit comprising a plurality of electronic components arranged and connected to each other in order to ensure a pre-charging of the global bit-line before or during a first phase of a read operation may occur.

The term 'evaluation and translation circuit' may denote a plurality of electronic components arranged and connected to each other in order to ensure a detection of the stored bit in a selected SRAM cell even if the pre-charging is below a full swing pre-charge level. An additional task of the evaluation and translation circuit may also be to translate the comparatively low charge level of the global bit-line to stable and detectable levels and signals for down-stream electronic components.

The term 'programmable pre-charge voltage' may denote a voltage adjustable to a certain pre-definable and/or self-adjustable level. For example, the global bit-line may be pre-charged before reading with the programmable pre-charge voltage. The term 'net-list' may denote the connectivity of an electronic design. For example, a single net-list may be a list of all the component terminals that should be electrically connected together for the circuit to work. Net-lists usually convey connectivity information and provide nothing more than instances, nets, and perhaps some attributes.

In the following, a detailed description of the figures will be given. All instructions in the figures are schematic. Firstly, a diagram of groups of SRAM cells connected to a local bit-line and a global bit-line is shown. Afterwards, several alternative embodiments of the inventive memory cell arrangement of SRAM cell groups will be described.

FIG. 1 shows an example of SRAM cells connected to a shared global bit-line. Each SRAM cell 106 may be connected in groups to a common local bit-line LBL 108. The local bit-lines 108 may each be connected to a respective local read amplifier 104. The output of the local read amplifier 104 may be connected to a shared global bit-line 102. A skilled person would understand that the parasitic capacity 116 of a single ended global bit-line 102 is not to be underestimated, especially in the case in which a larger number of local read amplifiers 104 would be connected to the shared global bit-line.

An additional p-FET P0 may act as a pre-charge circuit together with a keeper/leakage compensation circuit 118. The additional p-FET P0 may be connected to a power supply voltage Vdd 110. If an inverted global bit-line pre-charge signal GPCHGN 112 is connected to the gate of P0, in particular with a transition from "1" to "0" 112a, the global bit-line voltage may show a transition 114 if a read "0" is performed, and a transition 117 if a read "1" is performed. It may be clear that a coincidence switching of a plurality of such instances, as shown in FIG. 1, may generate huge transient current peaks, and may require a comparability high average AC power.

Figure 2:
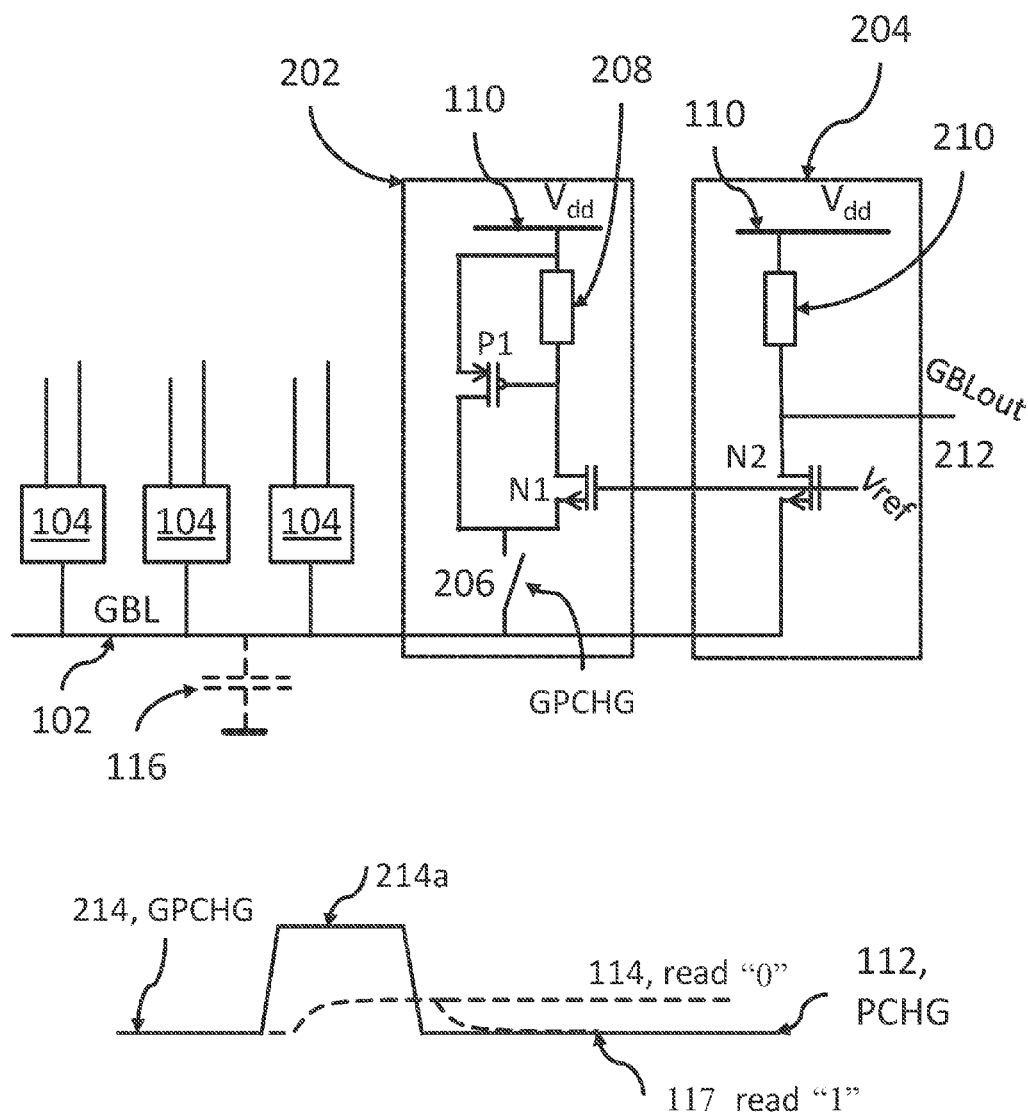
FIG. 2 illustrates a principal design of the inventive memory cell arrangement of SRAM cell groups, in accordance with embodiments of the present disclosure.

FIG. 2 shows a design of the inventive memory cell arrangement of SRAM cell groups, in accordance with various embodiments of the present disclosure. As already discussed in the context of FIG. 1, local read amplifiers 104 deliver their output signals to a shared global bit-line 102 having a parasitic or intrinsic capacity 116. The inputs of the local read amplifiers 104 are connected to local bit-lines 108 which are again connected to the 1-bit SRAM cells (not shown). Additionally, a pre-charge regulator circuit 202 and an evaluation and translation circuit 204 are shown.

The pre-charge regulator circuit 202 includes a first p-FET P1 connected with its source to power supply voltage Vdd 110, and with its drain to a 1st terminal of a switch 206—shown as an equivalent circuit—which receives a global bit-line pre-charge signal GPCHG 214, 214a. A second terminal of switch 206 is connected to the shared global bit-line 102. On the other side, a source of a 1st n-FET N1 is connected to the first terminal of switch 206. A drain of the 1st n-FET is connected to a gate of the 1st p-FET P1 as well as to a first terminal of a resistor 208. The second terminal of resistor 208 is connected to the power supply line 110. Details of the resistor 208 are explained in the subsequent figures.

Beside the pre-charge regulator circuit 202, an evaluation and translation circuit 204 is shown. The evaluation and translation circuit 204 includes a 2nd n-FET N2 which is connected with its source to the shared global bit-line 102 and with its drain to a second resistor 210 which may represent an equivalent circuit for details that are explained in the subsequent figures. The second resistor 210 may also be connected to the power supply voltage Vdd 110. A global bit-line output signal GBLout 212 is available at the drain of the 2nd n-FET N2. The gate of the 1st n-FET N1 and the gate of the 2nd n-FET N2 are together connected to a voltage Vref which is instrumental for setting the pre-charge level of the shared global bit-line 102.

A skilled person will understand that the 2nd n-FET N2 is connected between the shared global bit-line 102 and the global bit-line output signal GBLout 212. One of the tasks of the evaluation and translation circuit is to translate or transform the relatively low voltage of the shared global bit-line 102 to normal "0" and "1" levels, so that it can be interpreted as a logical "0" and a logical "1" from subsequent circuits. It may be clear that with these circuits 202 and 204, the pre-charge level on the shared global bit-line 102, as shown in FIG. 2, may be much lower than achievable with existing technologies. The pre-charge level may be stabilized by the evaluation and translation circuit 204, which can basically be seen as a replica of the pre-charge regulator circuit 202. The evaluation and translation circuit 204 also compensates a bit-line leakage current without changing the bit-line level. Additionally, the evaluation and translation circuit 204 provides for logic levels (Vdd/Vss) to downstream logic (see above). An optional bleeder device— to be explained below—may be used to further stabilize the bit-line level.

Figure 3:
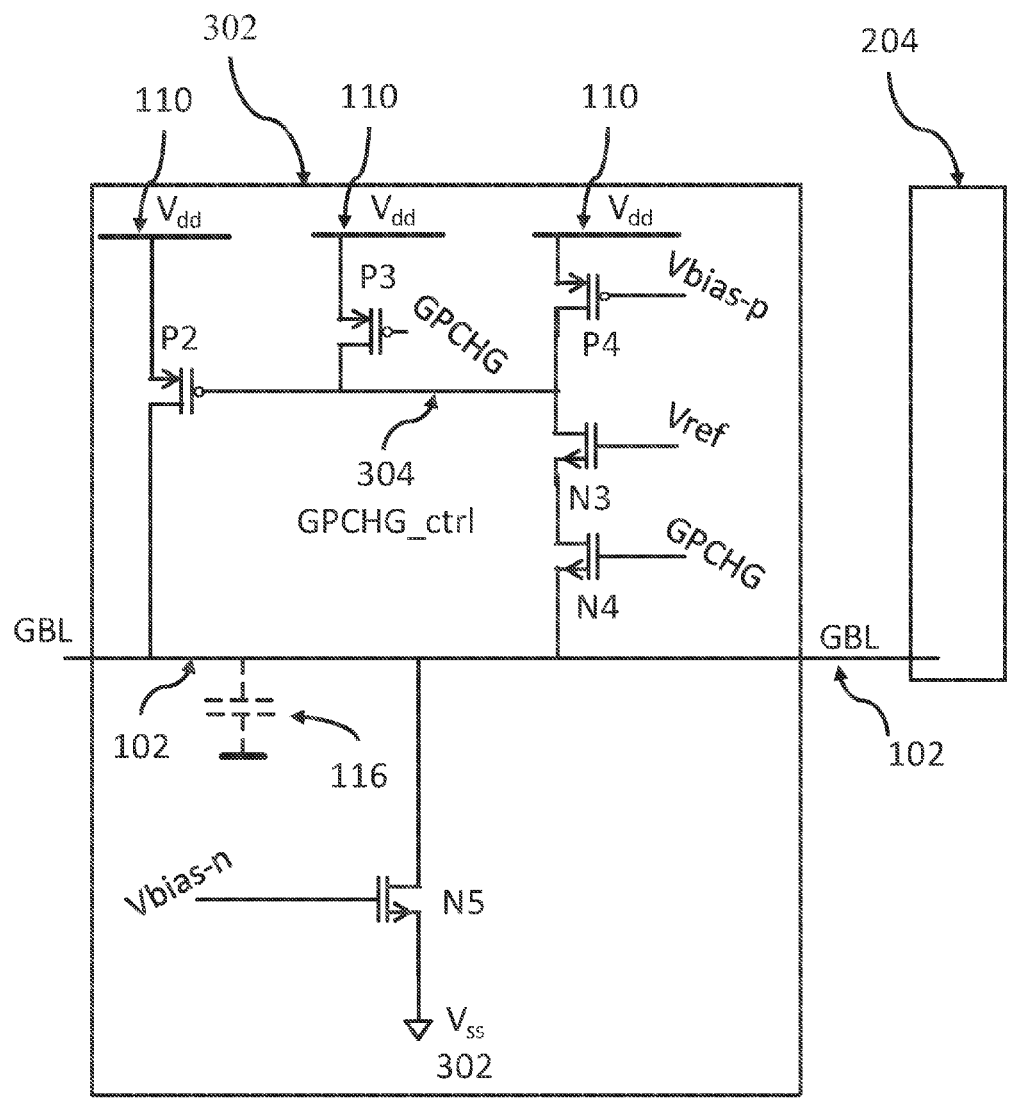
FIG. 3 illustrates an embodiment of the inventive pre-charge regulator, in accordance with embodiments of the present disclosure.

FIG. 3 shows an embodiment of the inventive pre-charge regulator circuit 302, in accordance with various embodiments of the present disclosure. The pre-charge regulator circuit 302 may be connected to the evaluation and translation circuit 204. A p-FET P2 is connected with its drain to the shared global bit-line 102 and its source to the power supply voltage Vdd 110. The shared global bit-line 102 may have a parasitic or intrinsic capacitance 116. A gate of p-FET P2 is connected to a drain of a p-FET P3. The p-FET P3's source may be connected to the power supply voltage Vdd 110. FIG. 3 also shows p-FET P4, which has a drain that is also connected to the gate of the p-FET P2 and which has a source that is connected to the power supply voltage Vdd 110. The connection 304 may be interpreted as the global bit-line pre-charge GPCHG control line. An n-FET N3 is also connected with its drain to the gate of the p-FET P2 and with its source to a drain of an n-FET N4. The n-FET N4's source is connected to the shared global bit-line 102. Moreover, a gate of the n-FET N4 and a gate of p-FET P3 are together connected to a global bit-line pre-charge line GPCHG, a gate of the n-FET N3 is connected to the reference voltage Vref line, and the gate of the p-FET P4 is connected to a Vbias-p line. The p-FET P4 may be seen as an equivalent to the first resistor 208 of FIG. 2.

Additionally, to stabilize the shared global bit-line level an n-FET N5 may be connected with its drain to the shared global bit-line 102 and with its source to ground Vss 302. The gate of n-FET N5 may receive a bias voltage Vbias-n in order to control the stabilization effect on the shared global bit-line and in order to keep the pre-charge regulator circuit and the evaluation and translation circuit in stable working conditions.

Figure 4:
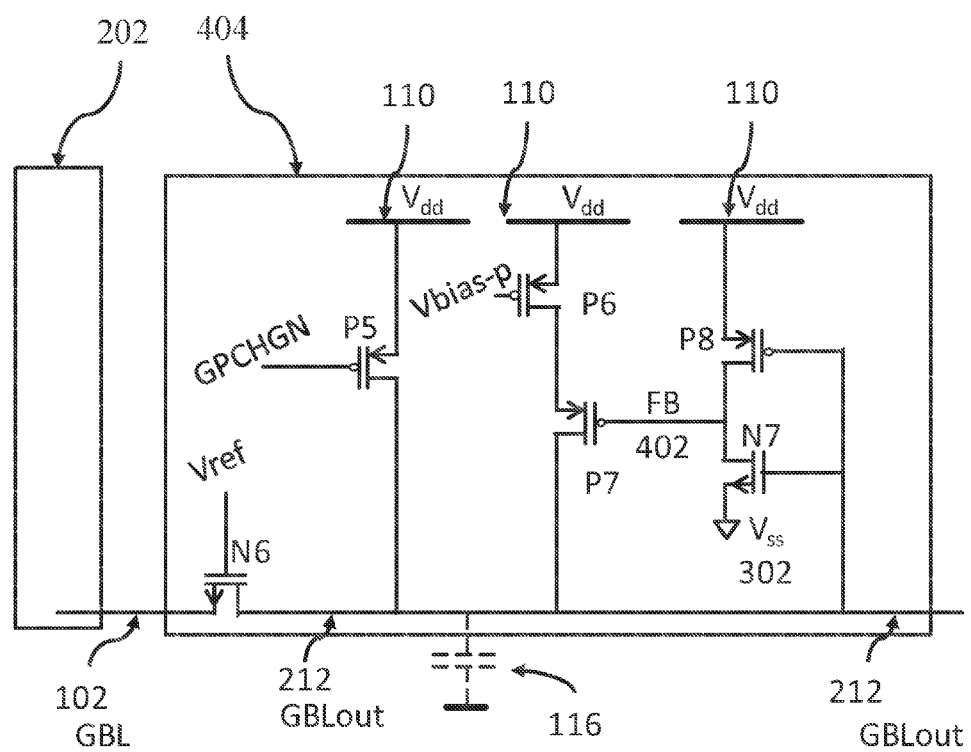
FIG. 4 illustrates a first implementation of the evaluation and translation circuit of the general layout of the evaluation and translation circuit of FIG. 2, in accordance with embodiments of the present disclosure.

FIG. 4 shows a first embodiment of the evaluation and translation circuit 404 as part of the limiter circuit. The evaluation and translation circuit 404 may be connected to the pre-charge regulator circuit 202. An n-FET N6 is connected with its source to the shared global bit-line 102 and with its drain the global bit-line out terminal 212. Accordingly, the shared global bit-line 102 and the signal at the global bit-line out terminal 212 may be separated from each other. The global bit-line 102 and the global bit-line out terminal 212 may show different voltage levels for a logical "0," or a logical "1." The global bit-line 102 may have a parasitic capacitance 116.

As can be seen in FIG. 4, p-FET P5 is connected with its drain to the global bit-line out terminal 212 and with its source to the power supply voltage Vdd 110. p-FET P6 is connected with its source to the power supply voltage Vdd 110 and with its drain to a source of a p-FET P7 which is connected with its drain to the global bit-line out terminal 212. A gate of the p-FET P7 is connected to a drain of a p-FET P8 which is connected with its source to the power supply voltage Vdd 110. The gate of the p-FET P7 is also connected to a drain of an n-FET N7 which is connected with its source to ground Vss, 302. Moreover, the reference voltage Vref signal is connected to a gate of the n-FET N6, the Vbias-p signal is connected to a gate of the p-FET P6, and an inverted signal of the global bit-line pre-charge signal GPCHGN is connected to a gate of the p-FET P5.

With this setup, the p-FETs P7 and P8 and the n-FET N7 build a sort of a feedback loop 402 as part of the keeper part of the evaluation and translation circuit 404. This interrupts the path from Vdd through p-FET P6 and p-FET P7 to the global bit-line out 212 in order to prevent a cross-current from Vdd to the pull-down device when a read amplifier tries to discharge the shared global bit-line and thus, to save power and accelerate the evaluation phase.

Again, p-FET P6 may be seen as an equivalent to the second resistor 210 of FIG. 2. The combination of the pre-charge regulator 202 of FIG. 3 and the evaluation and translation circuit 404 of FIG. 4 enable a fast and power saving implementation of the inventive concept.

It may also be noted that the reference voltage Vref may be controlled with a so-called PVT circuit (process voltage temperature) that may reflect the current status of the SRAM cell arrangement. If, for example, the power supply voltage Vdd 110 may be higher than expected, the pre-charge level of the shared global bit-line 102 does not have to go up as well. It may stay at the low level as defined by the reference voltage Vref. In the traditional technologies, the pre-charge level may go up with an increasing power supply voltage Vdd 110. A comparable concept may apply to the Vbias-p and Vbias-n signal levels.

Figure 5:
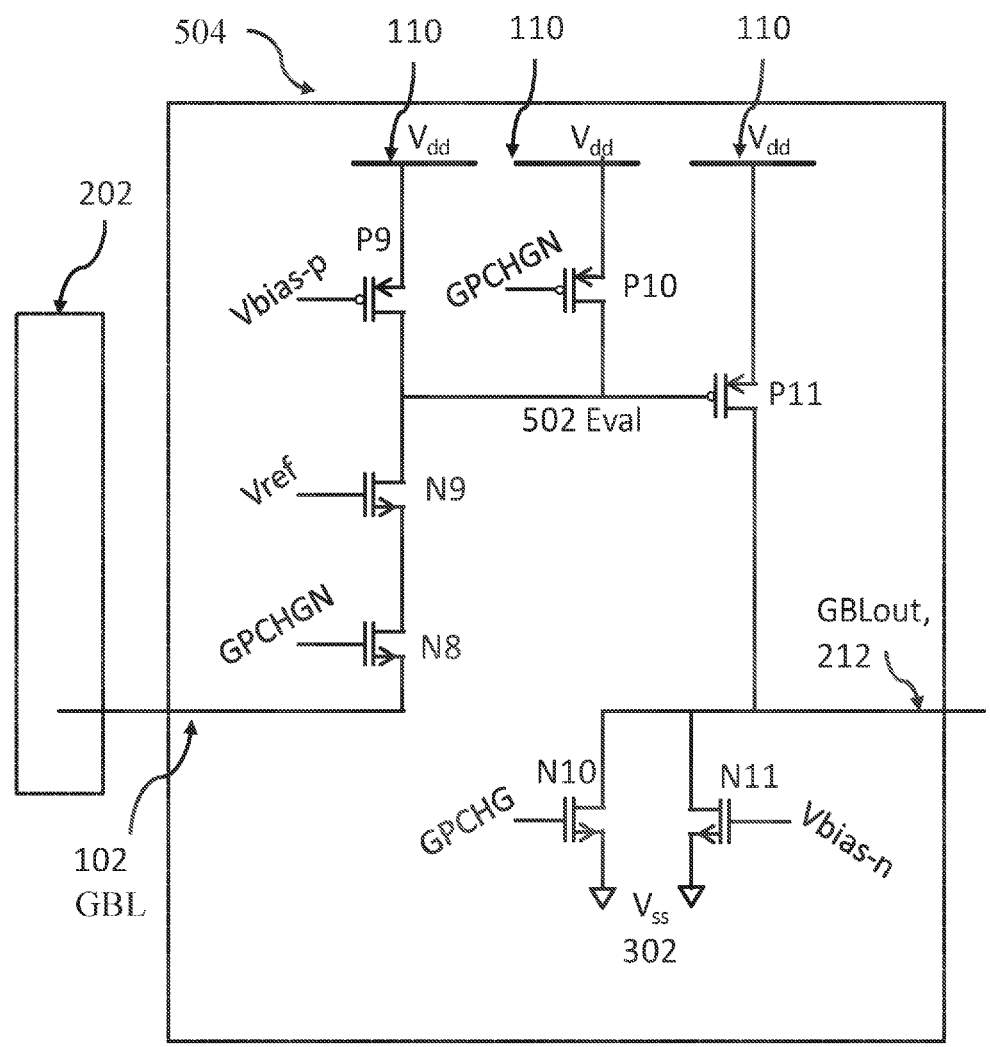
FIG. 5 illustrates a second implementation of the evaluation and translation circuit of the general layout of the evaluation and translation circuit of FIG. 2, in accordance with embodiments of the present disclosure.

FIG. 5 shows a second embodiment of the evaluation and translation circuit 504. The evaluation and translation circuit 504 may be connected to a pre-charge regulator circuit 202. For this, FIG. 5 shows that the evaluation and translation circuit 504 comprises an n-FET N8 which is connected with its source to the global bit-line 102 and with its drain to a source of an n-FET N9 which is connected with its drain to a p-FET P9 which is connected with its source to the power supply voltage Vdd 110. A p-FET P10 is connected with its source to the power supply voltage Vdd 110 and with its drain to the drain of the p-FET P9. A p-FET P11 is connected with its source to the power supply voltage Vdd 110 and with its gate to the drain of the n-FET N9. The connection between the p-FET P11 gate and the n-FET N9 drain make an "Eval" line 502.

A drain of the p-FET P11 is connected to the global bit-line out terminal 212. A drain of an n-FET N10 and a drain of an n-FET N11 are connected to the global bit-line out terminal 212. A source of n-FET N10 and a source of the n-FET N11 are connected to ground Vss 302.

The reference voltage Vref signal is connected to a gate of the n-FET N9. The bias voltage Vbias-p signal is connected to a gate of the p-FET P9. An inverted signal of the global bit-line pre-charge signal GPCHGN is connected to a gate of the 10th p-FET transistor, and the global bit-line pre-charge signal GPCHG is connected to a gate of the n-FET N10. The bias voltage Vbias-n signal is connected to a gate of the n-FET N11.

This embodiment of the evaluation and translation circuit 504 may be faster than the first embodiment of the evaluation translation circuit 204, however, it may save less power than the first embodiment. Also here, the shared global bit-line 102 is separated from the global bit-line out signal 212. Again, p-FET P9 may be seen as the equivalent to the second resistor 210 of FIG. 2.

Figure 6:
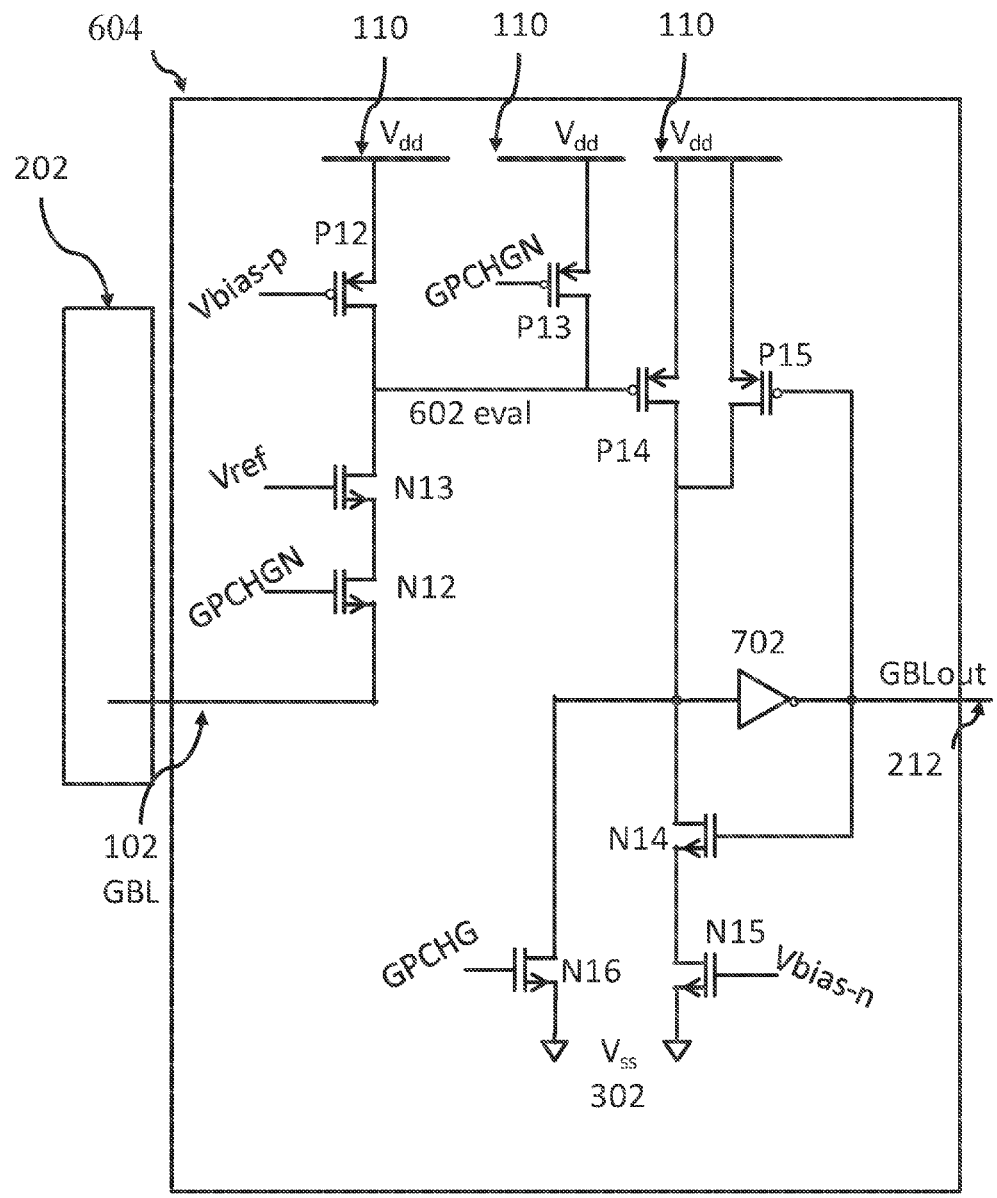
FIG. 6 illustrates a third implementation of the evaluation and translation circuit of the general layout of the evaluation and translation circuit of FIG. 2, in accordance with embodiments of the present disclosure.

FIG. 6 shows a third implementation of the evaluation and translation circuit 604 of the general layout of the evaluation and translation circuit 204 according to FIG. 2. The evaluation and translation circuit 604 may be connected to a pre-charge regulator circuit 202. The evaluation and translation circuit 604 comprises here an n-FET N12 which is connected with its source to the global bit-line 102 and with its drain to a source of an n-FET N13. The n-FET N13 may be connected with its drain to a drain of a p-FET P12 which is connected through its source to the power supply voltage Vdd 110.

A p-FET P13 is connected with its source to the power supply voltage Vdd 110 and with its drain to the drain of the p-FET P12. A p-FET P14 is connected through its source to the power supply voltage Vdd and through its gate to the drain of the n-FET N13, making an "Eval." Line 602. An n-FET N14 is connected with its drain to a drain of the p-FET P14 and with its source to a drain of an n-FET N15 which is connected with its source to ground Vss 302.

An n-FET N16 is connected with its drain to the drain of the p-FET P14 and with its source to ground Vss 302. An inverter 702 is connected with its input to the drain of the p-FET P14 and with its output to the global bit-line out terminal 212. A p-FET P15 is connected through its source to the power supply voltage Vdd 110 and through its drain to the drain of the p-FET P14. The p-FET P15 may be connected through its gate to the global bit-line out terminal 212. A gate of the n-FET N14 is also connected to the global bit-line out terminal 212.

The reference voltage Vref signal is connected to a gate of the n-FET N13, an inverted signal of the Vbias-p signal is connected to a gate of the p-FET P12, an inverted signal of the global bit-line pre-charge signal GPCHGN is connected to a gate of the p-FET P13, and the global bit-line pre-charge signal GPCHG is connected to a gate of the n-FET N16. Finally, the Vbias-n signal is connected to a gate of the n-FET N15.

It may be noted that the speed of this evaluation and translation circuit 604 is in between the first embodiment of the evaluation and translation circuit 404 according to FIG. 4 and the second embodiment of the evaluation and translation circuit 504 according to FIG. 5. However, the power saving enhancements may be higher if compared to the second evaluation and translation circuit embodiment according to FIG. 5.

Figure 7:
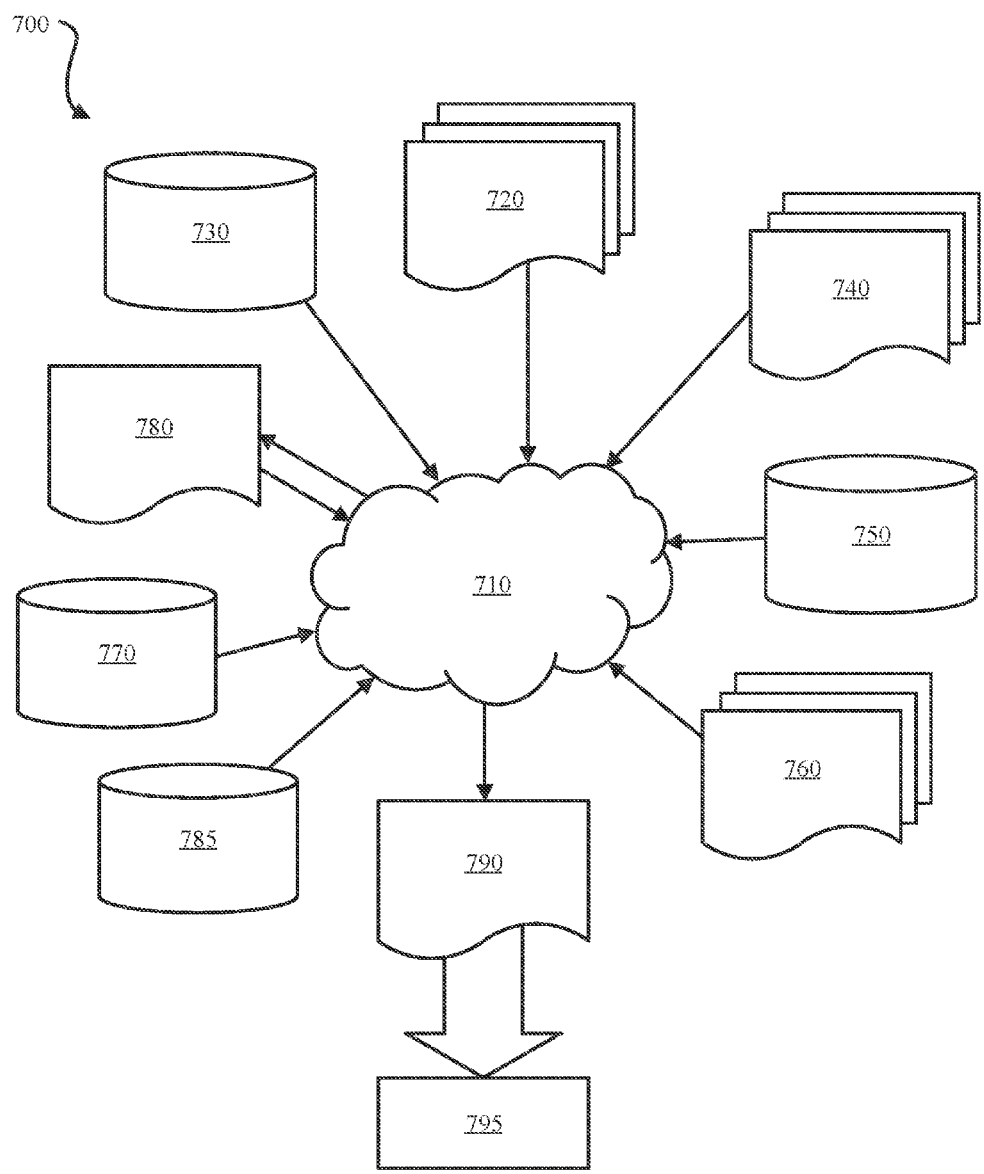
FIG. 7 illustrates a flow diagram of a design process used in semiconductor design, manufacture, and/or test, in accordance with embodiments of the present disclosure.

FIG. 7 shows a block diagram of an exemplary design flow 700 used for example, in semiconductor IC logic design, simulation, test, layout, and manufacture. Design flow 700 includes processes, machines, and/or mechanisms for processing design structures or devices to generate logically or otherwise functionally equivalent representations of the design structures and/or devices described above and shown in FIGS. 1 through 6. The design structures processed and/or generated by design flow 700 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a machine-readable data transmission, gate array, or storage medium, design structure 720 may be accessed and processed by one or more hardware and/or software modules within design process 710 to simulate or otherwise functionally represent an electronic component, circuit, electronic or logic module, apparatus, device, or system such as those shown in FIGS. 1 through 6. As such, design structure 720 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of the components, circuits, devices, or logic structures shown in FIGS. 1 through 6 to generate a netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 710 may include hardware and software modules for processing a variety of input data structure types including netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1 through 6. In one embodiment, design structure 790 may comprise a compiled, executable HDL simulation model that functionally simulates the devices shown in FIGS. 1 through 6.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1 through 6. Design structure 790 may then proceed to a stage 795 where, for example, design structure 790: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

The terminology used herein is for the purpose of describing particular embodiments only and is not intended to limit the invention. As used herein, the singular forms "a," "an," and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

What is claimed is:

1. A memory cell arrangement of Static Random-Access Memory (SRAM) cells comprising:
   one or more SRAM cell groups,
   wherein each of the one or more SRAM cell groups includes two or more SRAM cells that are connected to an input of a local read amplifier by at least one common local bit-line, and
   wherein outputs of local read amplifiers are connected to a shared global bit-line, the shared global bit-line being connected to a pre-charge circuit that is adapted for pre-charging the shared global bit-line with a programmable pre-charge voltage before reading data, the pre-charge circuit including a limiter circuit comprising:
     a pre-charge regulator circuit connected to the shared global bit-line to pre-charge the shared global bit-line with the programmable pre-charge voltage; and
     an evaluation and translation circuit connected to the pre-charge regulator circuit and the shared global bit-line to compensate for leakage current of the shared global bit-line without changing a voltage level of the global bit-line.

2. The memory cell arrangement of claim 1, wherein the programmable pre-charge voltage is below half of a value of a power supply voltage.

3. The memory cell arrangement of claim 1, wherein a reference voltage (Vref) signal is adapted for controlling a pre-charge level of the shared global bit-line.

4. The memory cell arrangement of claim 3, wherein at least one out of the group comprising the Vref, a Vbias-n signal, and a Vbias-p signal is controlled by a process-voltage-temperature circuit.

5. The memory cell arrangement of claim 1, wherein the two or more SRAM cells are bipolar based SRAM cells.

6. The memory cell arrangement of claim 1, wherein the programmable pre-charge voltage is based on environmental parameters.

7. The memory cell arrangement of claim 6, wherein the environmental parameters include one or more selected from the group consisting of a power supply voltage, a temperature of the SRAM cells, and an operating frequency.

8. The memory cell arrangement of claim 1, wherein the shared global bit-line is a line connected to a plurality of local read amplifiers,
wherein the pre-charge regulator circuit includes a first plurality of interconnected electronic components configured to ensure a pre-charging of the shared global bit-line during a first phase of a read operation,
wherein the evaluation and translation circuit includes a second plurality of interconnected components configured to ensure a detection of a bit stored in a selected SRAM cell when the pre-charging is below a full swing pre-charge level and to translate a low charge level of the shared global bit-line to a detectable level for down-stream electronic components, and
wherein the programmable pre-charge voltage is self-adjustable and is based on environmental parameters.

9. The memory cell arrangement of claim 1, wherein the pre-charge regulator circuit comprises:
a 1st p-FET connected with its source to a power supply voltage and its drain to a first terminal of a pre-charge switch which is connected with its second terminal to the shared global bit-line; and
a 1st n-FET which is connected with its source to the first terminal of the pre-charge switch, wherein a drain of the 1st n-FET is connected to a gate of the 1st p-FET as well as to a first terminal of a programmable resistor which is connected with its second terminal to the power supply voltage.

10. The memory cell arrangement of claim 9, wherein a gate of the 1st n-FET is connected to a reference voltage (Vref) signal, and wherein the pre-charge regulator circuit is configured to pre-charge the shared global bit-line during a first phase of a read operation.

11. The memory cell arrangement of claim 1, wherein the evaluation and translation circuit comprises:
a 1st n-FET connected with its source to the shared global bit-line and with its drain to a first terminal of a programmable resistor which is connected with its second terminal to a power supply voltage,
wherein a gate of the 1st n-FET is connected to a Vref signal, and
wherein a global bit-line out terminal is connected to the drain of the 1st n-FET.

12. The memory cell arrangement of claim 1, wherein the evaluation and translation circuit comprises:

a 1st n-FET which is connected with its source to the shared global bit-line and with its drain to a source of a 2nd n-FET which is connected with its drain to a drain of a 1st p-FET which is connected with its source to a power supply voltage;
a 2nd p-FET which is connected with its source to the power supply voltage and with its drain to the drain of the 1st p-FET; and
a 3rd p-FET which is connected with its source to the power supply voltage and with its gate to the drain of the 2nd n-FET,
wherein a drain of the 3rd p-FET is connected to a global bit-line out terminal,
wherein a Vref signal is connect to a gate of the 2nd n-FET,
wherein a Vbias-p signal is connected to a gate of the 1st p-FET, and
wherein an inverted signal of a global bit-line pre-charge signal is connected to a gate of the 2nd p-FET.

13. A design structure tangibly embodied in a non-transitory machine-readable storage medium for designing, manufacturing, or testing an integrated circuit, the design structure comprising:
one or more Static Random-Access Memory (SRAM) cell groups,
wherein each of the one or more SRAM cell groups includes two or more SRAM cells that are connected to an input of a local read amplifier by at least one common local bit-line, and
wherein outputs of local read amplifiers are connected to a shared global bit-line, the shared global bit-line being connected to a pre-charge circuit that is adapted for pre-charging the shared global bit-line with a programmable pre-charge voltage before reading data, the pre-charge circuit including a limiter circuit comprising:
a pre-charge regulator circuit connected to the shared global bit-line to pre-charge the shared global bit-line with the programmable pre-charge voltage; and
an evaluation and translation circuit connected to the pre-charge regulator circuit and the shared global bit-line to compensate for leakage current of the shared global bit-line without changing a voltage level of the global bit-line.

14. The design structure of claim 13, wherein the design structure further comprises a netlist which describes a memory cell arrangement of SRAM cell groups.

15. The design structure of claim 13, wherein the design structure includes at least one set of test data, characterization data, verification data, or design specifications.

16. The design structure of claim 13, wherein the design structure resides on storage medium as a data format used for an exchange of layout data of integrated circuits.

17. The design structure of claim 13, wherein the programmable pre-charge voltage is below half of a value of a power supply voltage.

18. The design structure of claim 13, wherein a reference voltage (Vref) signal is adapted for controlling a pre-charge level of the shared global bit-line.

19. The design structure of claim 18, wherein at least one out of the group comprising the Vref, a Vbias-n signal, and a Vbias-p signal is controlled by a process-voltage-temperature circuit.

20. The design structure of claim 13, wherein the two or more SRAM cells are bipolar based SRAM cells.

* * * * *